(12) United States Patent
Yang et al.

(10) Patent No.: US 9,153,344 B1
(45) Date of Patent: Oct. 6, 2015

(54) DEVICE FOR DETECTING DEFECTIVE GLOBAL WORD LINE

(71) Applicant: INTEGRATED CIRCUIT SOLUTION INC., Hsin-Chu (TW)

(72) Inventors: Lien-Sheng Yang, Hsin-Chu (TW); Hung-Wen Chang, Hsin-Chu (TW)

(73) Assignee: INTEGRATED CIRCUIT SOLUTION INC., Hsin-Chu (TW)

( * ) Notice: Subject to any disclaimer, the term of this patent is extended or adjusted under 35 U.S.C. 154(b) by 0 days.

(21) Appl. No.: 14/525,399

(22) Filed: Oct. 28, 2014

(30) Foreign Application Priority Data

Jul. 31, 2014 (TW) .............................. 103126261 A

(51) Int. Cl.
*G11C 29/00* (2006.01)
*G11C 11/401* (2006.01)
*G11C 29/04* (2006.01)

(52) U.S. Cl.
CPC .............. *G11C 29/04* (2013.01); *G11C 11/401* (2013.01)

(58) Field of Classification Search
CPC .............................. G11C 29/04; G11C 11/401
See application file for complete search history.

(56) References Cited

U.S. PATENT DOCUMENTS

| | | | |
|---|---|---|---|
| 5,331,594 A * | 7/1994 | Hotta | 365/201 |
| 5,343,431 A * | 8/1994 | Ohtsuka et al. | 365/201 |
| 5,371,712 A * | 12/1994 | Oguchi et al. | 365/230.06 |
| 5,440,516 A * | 8/1995 | Slemmer | 365/201 |
| 6,501,691 B2 * | 12/2002 | Kawamoto et al. | 365/201 |
| 2011/0194360 A1 * | 8/2011 | Yamada | 365/189.07 |

* cited by examiner

*Primary Examiner* — J. H. Hur
(74) *Attorney, Agent, or Firm* — Lin & Associates IP, Inc.

(57) ABSTRACT

A device for detecting defective memory includes a first global word line; a second global word line; a global word-line front end, connected to the first global word line; a global word-line driver, connected to the global word-line front end and driving the first global word line; a local word-line driver, connected to the first global word line and driving a local word line; and a voltage-controlled transistor, including a first terminal connected to the first global word line, a second terminal connected to a connection line between the global word-line front end and the global word-line driver, and a third terminal outputting a test current.

6 Claims, 2 Drawing Sheets

DEVICE FOR DETECTING DEFECTIVE GLOBAL WORD LINE

CROSS-REFERENCES TO RELATED APPLICATION

This application claims the priority of Taiwanese patent application No. 103126261, filed on Jul. 31, 2014, which is incorporated herewith by reference.

BACKGROUND OF THE INVENTION

1. Field of the Invention

The present invention relates to a detecting device, and more particularly, relates to a device for detecting defective memory.

2. The Prior Arts

Nowadays, due to advances in semiconductor processes and personal computers, computer memory has become an essential electronic device of personal computers. Computer memory is an electronic device manufactured from semiconductor process technologies, for storing data.

In general, computer memory can be classified into two types according to the storage ability and power supply relationships: volatile memory and non-volatile memory. Volatile memory is memory that will lose all data stored when there is an interruption to the power supply. Non-volatile memory is memory that will not lose stored data even when there is interruption to the power supply; further, the data stored in the memory can be accessed once again when the power supply is restored.

Moreover, volatile memory mainly includes: static random access memory (SRAM) and dynamic random access memory (DRAM). The advantage of SRAM is high speed, but the resource occupied in each cell of this type of memory is more in comparison with DRAM. Additionally, the advantage of DRAM is that each cell of this type of memory requires less resource and occupies small space. However, the speed of DRAM is slower than that of SRAM. Generally, computer memory is mostly made of DRAM.

However, the prior art has shown that as a result of advances in semiconductor processes, the distances between the plurality of global word lines of computer memory have become extremely small. This is especially true for the plurality of global word lines in DRAM. As such, the testing of the above-mentioned DRAM is very important. However, in the actual environment, since the leakage current leaked from the plurality of transistors in the interior of DRAM is small, whether there is a short circuit between the plurality of global word lines of DRAM cannot be accurately detected. Thus, in order to solve the problem of not being able to directly and accurately detect a short circuit between the plurality of global word lines of DRAM, the present invention provides a device for detecting defective memory that can effectively detect whether a defect exists between the plurality of global word lines (such as a short circuit) in DRAM.

As such, the present invention may provide a device that allows the user to effectively detect whether there is a defect between the plurality of global word lines, and the device of the present invention ideally has the benefit of not needing to redesign DRAM, and at the same time having the characteristics of being useful and stable, having reduced testing costs and being easy to use.

SUMMARY OF THE INVENTION

In light of the foregoing drawbacks of the prior art, an objective of the present invention is to provide a device for users such that the global word lines within the dynamic random access memory (DRAM) can be directly tested, without the need for additional designs of elements or circuits, on the basis of the original memory circuit. Thus, the device of the present invention may reduce the defects caused by manufacturing DRAM.

To achieve the aforesaid objective, the present invention provides a device for detecting defective memory, including a first global word line, which also includes a parasitic capacitance; a second global word line; a global word-line front end; a global word-line driver, connected to the global word-line front end and driving the first global word line; a local word-line driver, connected to the first global word line and driving a local word line; and a voltage-controlled transistor, including a first terminal, a second terminal and a third terminal, wherein the first terminal may be connected to the first global word line, the second terminal may be connected to a connection line between the global word-line front end and the global word-line driver, and the third terminal may output a test current.

According to the present invention, the global word-line front end may include a plurality of global word-line front end transistors. The global word-line driver may include a plurality of global word-line driver transistors. The local word-line driver may include a plurality of local word-line driver transistors.

Moreover, according to the present invention, the voltage-controlled transistor may be a field effect transistor, and the second terminal and third terminal of the voltage-controlled transistor may be interchangeable.

Further, according to the present invention, when the defective memory is detected, the voltage-controlled transistor is operated in the active region to amplify the test current.

On the basis of the device, when a global word-line pull-down path is floated, the third terminal of the voltage-controlled transistor may output the test current.

In addition, according to the present invention, besides the first global word line and the second global word line, the device of the present invention may include a plurality of global word lines.

In comparison with the prior art, the present invention not only detects defects of the global word lines within the memory (for example, a short circuit between two global word lines caused by semiconductor processes), but also detects defects between the global word-lines within the memory and the power supply line. Further, while detecting defects in the plurality of global word lines, the present invention also allows the user to directly perform the detection based on the memory circuit, without the need to design additional circuit testing. Thus, the device for detecting defective memory of the present invention has the benefits of reducing testing costs and simplified operational procedures.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
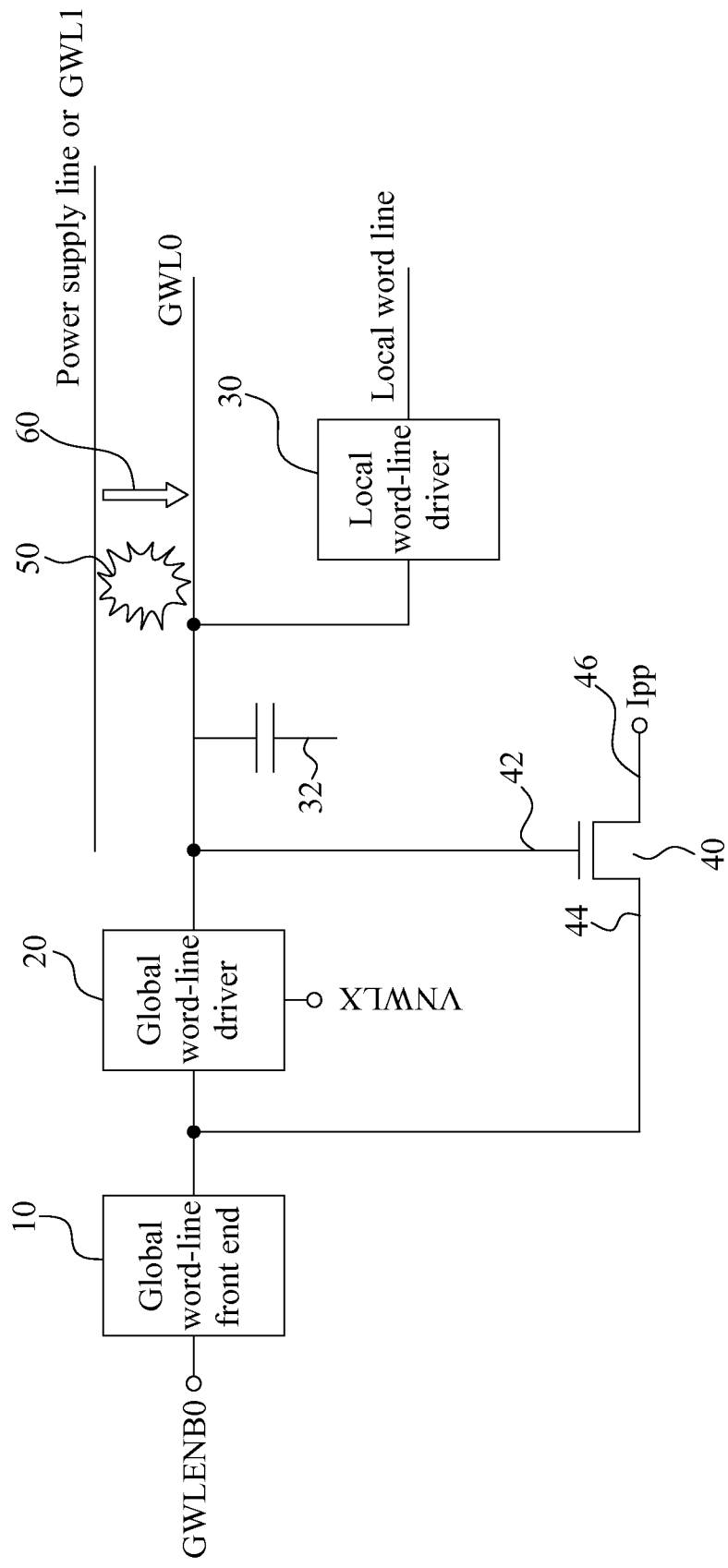
FIG. 1 is a block diagram of the device that detects defective memory according to an embodiment of the present invention.
Figure 2:
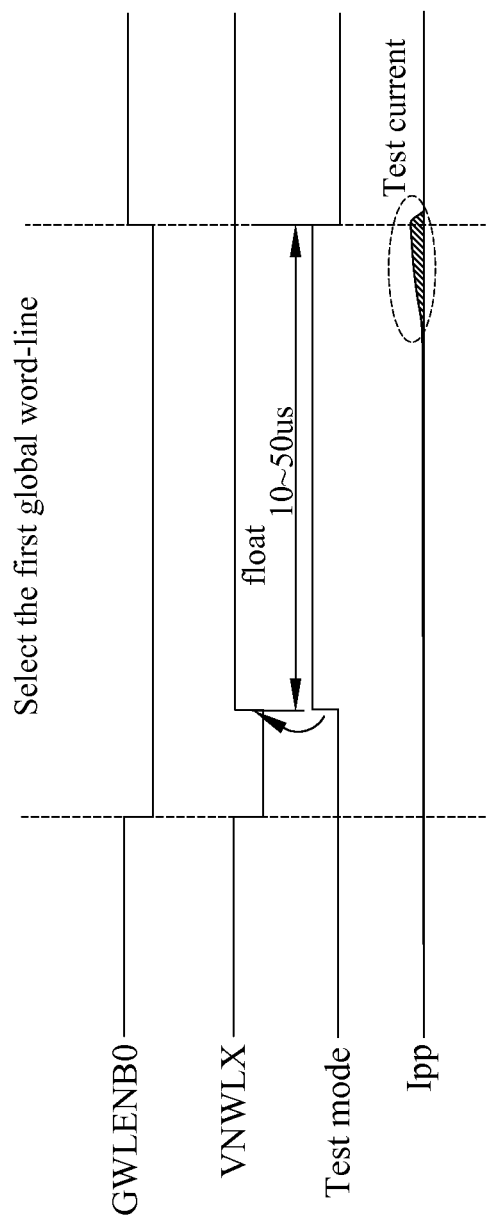
FIG. 2 shows a waveform diagram of the device that detects defective memory according to the embodiment of the present invention.

With regard to FIGS. 1-2, the drawings showing embodiments are semi-diagrammatic and not to scale and, particularly, some of the dimensions are for clarity of presentation and are shown exaggerated in the drawings. Similarly, although the views in the drawings for ease of description generally show similar orientations, this depiction in the drawings is arbitrary for the most part. Generally, the present invention can be operated in any orientation.

To solve the above-mentioned problem, as shown in FIG. 1, the present invention provides a device for detecting defective memory, via the method of IDDQ testing. The device of the present device may include a first global word line GWL0, which has a parasitic capacitance; a second global word line GWL1; a global word-line front end 10; a global word-line driver 20, which is connected to the global word-line front end 10 and driving the first global word line GWL0; a local word-line driver 30, which is connected to the first global word line GWL0 and driving a local word line; and a voltage-controlled transistor 40, including a first terminal 42, a second terminal 44 and a third terminal 46, wherein the first terminal 42 is connected to the first global word line GWL0, the second terminal 44 is connected to a connection line between the global word-line front-end 10 and global word-line driver 20; and the third terminal 46 outputs a test current Ipp.

Moreover, the voltage-controlled transistor 40 may be a field effect transistor (FET), and the second terminal 44 and the third terminal 46 of the voltage-controlled transistor may be interchangeable.

According to an embodiment of the present invention, the global word-line front end 10 may include a plurality of global word-line front-end transistors. The global word-line driver 20 may include a plurality of global word-line driver transistors, and the local word-line driver 39 may include a plurality of local word-line driver transistors.

In other words, according to the embodiment of the present invention, when detecting whether there is a short circuit 50 in between the global word-line GWL0 and GWL1 in the interior of the memory, or detecting whether there is a short circuit 50 in between the global word-line GWL0 and the power supply line in the interior of the memory, the pull down path of the global word-line driver 20 is floated. If a short circuit 50 exists in between the two global word lines GWL0 and GWL1 within the memory (or if the short circuit exists between the global word line GWL0 and the power supply line), then there may be a current 60 flowing through the two global word lines GWL0 and GWL1 (or flowing through the power supply line and the global word line GWL0). This enables the parasitic capacitance 32 of the first global word line to be charged, and the voltage produced by the parasitic capacitance 32 may enable the voltage-controlled transistor 40 to be on, and the voltage-controlled transistor 40 operates in the active region to amplify the test current Ipp. Thus, the third terminal 46 of the voltage-controlled transistor 40 may output a larger test current Ipp (for example, 80 μA). Preferably, the voltage-controlled transistor may output the test current Ipp that may be larger than 80 μA.

According to the embodiment of the present invention, besides the first global word line GWL0 and the second global word line GWL1, the device of the present invention may also include a plurality of global word lines.

FIG. 2 shows a waveform diagram of the device that detects defective memory according to the embodiment of the present invention.

The technical features of the device for detecting defective memory of the present invention may be illustrated in FIGS. 1 and 2. The exemplary embodiment describes the principle and effect of the present invention, but is not limited to the present invention.

According to the embodiment of the present invention, firstly, a low logic level is inputted to the input terminal GWLENB0 of the global word-line front end 10 to select the first global word-line GWL0 as a global word line to be tested.

Subsequently, an active signal is inputted to the control terminal VNWLX of the global word-line driver 20 to float the global word-line pull-down path.

Additionally, the test mode of the present invention has been set for a period of time (for example, 20 μs~40 μs), preferably, it may be set at 10 μs~50 μs.

Thus, as shown in FIG. 1, if a short circuit 50 exists between two global word-lines within the memory (for example, a short circuit exists between the first global word line GWL0 and the second global word line GWL1), then there may be a current 60 flowing through the two global word lines GWL0 and GWL1, so as to enable the parasitic capacitance 32 of the first global word line to be charged. The voltage generated by the parasitic capacitance 32 may enable the voltage-controlled transistor 40 to be on, such that the voltage-controlled transistor 40 is operated in the active region to amplify the test current Ipp. As such, the third terminal 46 of the voltage-controlled transistor 40 may output a larger test current Ipp (for example, 80 μA). Additionally, the test current Ipp outputted by the voltage-controlled transistor may be larger than 80 μA.

According to another embodiment of the present invention, if a short circuit 50 exists between a first global word-line GWL0 and a power supply line in the memory, then there may be a current 60 flowing through the first global word line GWL0 and the power supply line. This causes the parasitic capacitance 32 of the first global word line GWL0 to be charged. The voltage generated by the parasitic capacitance 32 may enable the voltage-controlled transistor to be on. After that, the voltage-controlled transistor 40 operates in the active region so as to amplify the test current Ipp. Accordingly, the third terminal 46 of the voltage-controlled transistor 40 may output a larger test current Ipp (for example, 80 μA). In addition, the output test current Ipp of the voltage-controlled transistor may be larger than 80 μA.

It should be noted that the voltage-controlled transistor 40 of the present invention may be a field effect transistor (FET), and the second terminal 44 and the third terminal 46 of the voltage-controlled transistor 40 may be interchangeable.

Further, besides the first global word line and the second global word line, as shown in FIG. 1, the device of the present invention may also include a plurality of global word lines.

Moreover, the global word-line front end 10 may also include a plurality of global word-line front-end transistors. The global word-line driver 20 may include a plurality of global word-line driver transistors. In addition, the local word-line driver may include a plurality of local word-line driver transistors. Therefore, when detecting the defects between the plurality of global word lines, the present invention may allow the user to perform detection based on the memory circuit itself, without the need to design additional test circuits.

In view of the above, the present invention provides a device for detecting defects of global word-lines which are suitable for memories. The device of the present invention allows the user to directly perform detection based on the memory circuit itself, without the need to design additional test circuits. Thus, the present invention has not only solved the problem of performing detection of defects of global word-lines that current technologies are unable to solve, the device of the present invention has further reduced the costs of testing and increased stability of tests.

The above exemplary embodiment describes the principle and effect of the present invention, but is not intended to limit to the present invention. It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A device for detecting defective memory, comprising:
    a first global word line, comprising a parasitic capacitance;
    a second global word line;
    a global word-line front end;
    a global word-line driver, connected to the global word-line front end and driving the first global word line;
    a local word-line driver, connected to the first global word line and driving a local word line; and
    a voltage-controlled transistor, comprising a first terminal, a second terminal and a third terminal, wherein the first terminal is connected to the first global word line; the second terminal is connected to a connection line between the global word-line front end and the global word-line driver, and the third terminal outputs a test current.

2. The device according to claim 1, wherein the global word-line front end comprises a plurality of global word-line front-end transistors, the global word-line driver comprises a plurality of global word-line driver transistors, and the local word-line driver comprises a plurality of local word-line driver transistors.

3. The device according to claim 1, wherein the voltage-controlled transistor is a field effect transistor, and the second terminal and third terminal of the voltage-controlled transistor are interchangeable.

4. The device according to claim 1, wherein when the defective memory is detected, the voltage-controlled transistor is operated in the active region to amplify the test current.

5. The device according to claim 1, wherein when the global word-line driver is floated, the third terminal of the voltage-controlled transistor outputs the test current.

6. The device according to claim 1, wherein besides the first global word line and the second global word line, the device comprises a plurality of global word lines.

* * * * *